United States Patent
Galuschki et al.

(10) Patent No.: US 6,445,074 B1
(45) Date of Patent: Sep. 3, 2002

(54) ELECTRONIC COMPONENT MOUNTED ON A FLAT SUBSTRATE AND PADDED WITH A FLUID FILLER

(75) Inventors: Klaus-Peter Galuschki; Heinz Pilz, both of Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/516,605

(22) Filed: Apr. 3, 2000

Related U.S. Application Data

(63) Continuation of application No. 09/160,889, filed on Sep. 25, 1998, now Pat. No. 6,057,178.

(30) Foreign Application Priority Data

Sep. 26, 1997 (DE) .......................... 197 44 012

(51) Int. Cl.[7] .............................. H01L 23/28
(52) U.S. Cl. ...................... 257/778; 257/780
(58) Field of Search ................ 257/738, 780, 257/787, 790; 438/51, 115

(56) References Cited

U.S. PATENT DOCUMENTS

| | | | |
|---|---|---|---|
| 5,218,234 A | * | 6/1993 | Thompson et al. ......... 257/787 |
| 5,311,059 A | * | 5/1994 | Banerji et al. ............... 257/778 |
| 5,328,060 A | | 7/1994 | Kersten et al. |
| 5,697,148 A | | 12/1997 | Lance, Jr. et al. |
| 5,731,223 A | | 3/1998 | Padmanabhan |
| 5,766,982 A | * | 6/1998 | Akram et al. .................. 438/51 |

FOREIGN PATENT DOCUMENTS

| | | |
|---|---|---|
| DE | 30 40 867 | 5/1982 |
| DE | 196 22 684 | 12/1997 |
| EP | 0805486 A1 * | 5/1997 |

OTHER PUBLICATIONS

Bouras eet al. "Adhesive Dispensing For Flip Chip–On–Board", Electronic Packaging & Production, Ocy. 1995, pp. 9–11.

* cited by examiner

Primary Examiner—Nathan Flynn
Assistant Examiner—Leonardo Andujar
(74) Attorney, Agent, or Firm—Kenyon & Kenyon

(57) ABSTRACT

A method of padding an electronic component, mounted on a flat substrate, with a fluid filler, in which the fluid filler that is applied in a tight-fitting manner to the electronic component mounted n the substrate. The arrangement composed of substrate and electronic component is then heated. The substrate is provided with at least one through orifice in the area of the electronic component prior to applying the filler. The filler is applied at the end of the through orifice facing away from the electronic component.

1 Claim, 1 Drawing Sheet

ELECTRONIC COMPONENT MOUNTED ON A FLAT SUBSTRATE AND PADDED WITH A FLUID FILLER

This application is a continuation of U.S. patent application Ser. No. 09/160,889 filed on Sep. 25, 1998, now U.S. Pat. No. 6,057,178.

FIELD OF THE INVENTION

The present invention relates to a method of padding an electronic component, mounted on a flat substrate, with a free-flowing filler, in which the fluid filler is applied in a tight-fitting manner to the electronic component mounted on the substrate and flows into the arrangement composed of the substrate and electronic component under the effect of heat.

BACKGROUND INFORMATION

The document "Adhesive Dispensing for Flip Chip-on-Board," *Electronic Packaging & Production October* 1995, Advertising Insert pp. 9–11 describes a method of padding an electronic component. In this method, the electronic component, which may be a semiconductor chip, for example, is padded with a free-flowing filler after being mounted on a flat substrate, for example, on a printed circuit board, so that the filler is linearly applied to at least one edge of the electronic component using a dispenser. Under the effect of heat, the filler becomes fluid and penetrates by capillary action into the space between the electronic component and the substrate. Additional amounts of filler are then applied to those edges of the electronic component along which no filler was previously applied, so that a meniscus-shaped seal is achieved on all the edges of the electronic component.

SUMMARY OF THE INVENTION

An object of the present invention is to provide a method for padding an electronic component mounted on a flat substrate with a free-flowing filler that is relatively easy to accomplish.

To achieve this object, the substrate is provided with at least one through orifice in the area of the electronic component prior to the application of the filler, and the filler is applied on the end of the orifice facing away from the electronic component. The substrate may be a printed circuit board or foil, a ceramic substrate, or a load frame, for example; the electronic component is a flip chip or a ball grid array, for example. Filler is understood as being a mixture of resin and inorganic additives or particles.

One advantage of the invention is that when padding the electronic component, the filler penetrates underneath the electronic component into the space between the component and the substrate, so the filler expands in the space basically from the inside out in a way that all the air is displaced from the space between the electronic component and the substrate, while complete padding is achieved. Padding is done relatively rapidly, since the filler can expand on all sides from the at least one through orifice into the space between the electronic component and the substrate. Another advantage is that in the method according to the present invention, a meniscus-shaped seal forms by itself on all the edges of the electronic component, so that no subsequent operation is required. The cost of providing the at least one through orifice is relatively low.

In the method according to the present invention, the filler can be applied on the substrate if the electronic component is located as usual above the substrate. This applies particularly in the case when only a relatively small amount of filler is to be applied to the substrate due to a relatively small electronic component. This relatively small amount of filler does not drip off when heated, but is "sucked in" as known upward by capillary action through the orifice into the space between the electronic component and the substrate.

In the case of electronic components of typical dimensions, it is considered advantageous in the method according to the present invention if the arrangement composed of the substrate and the electronic component is brought into a position where the substrate faces upward prior to applying the filler. In this embodiment of the method according to the present invention, a relatively large amount of the filler applied also remains in the area of the through orifice and can flow into the space between the electronic component and the substrate under the effect of heat and capillary action.

In order to pad the electronic component in a particularly rapid manner, pressure is exerted on the filler applied by the method according to the present invention.

In order to pad the space between the electronic component and the substrate as quickly and reliably as possible overall, it is considered advantageous if the through orifice is provided in the substrate centered with respect to the electronic component.

In the method according to the present invention it is not necessary that the filler be applied onto the substrate using a dispenser. The filler can be applied by pouring, as long as the arrangement composed of the substrate and electronic component faces upward.

In the method according to the present invention, the through orifice can be advantageously used as a reservoir for the required amount of filler if the through orifice is sufficiently large. The filler that becomes fluid under the effect of heat cannot then expand on the side of the substrate facing away from the electronic component, but remains in the through orifice.

It is, however, also possible to provide the substrate with an ring-shaped piece mounted at the end of the through orifice facing away from the electronic component.

With the method according to the present invention, the filler can also be applied by pressing or stamping, in addition to applying it with a dispenser. Spraying the filler onto the substrate on the end facing away from the electronic component of the through orifice is also possible.

The present invention also relates to an arrangement with a flat substrate and an electronic component mounted on it, with the space between the electronic component and the substrate being padded with a fluid filler.

In order to design such an arrangement so that it is easy to manufacture, at least one through orifice is provided in the substrate under the electronic component for applying the filler.

If a single through orifice is provided for the arrangement, this is preferably centered in the substrate with the electronic component.

In the arrangement according to the present invention, the through orifice has a volume that is at least equal to that of the filler required for padding the electronic component.

In the arrangement according to the present invention, the volume in the area of the through orifice can be prepared so that the through orifice, configured as a through hole, for example, has a cross-section of a proper dimension. It is considered particularly advantageous if the through orifice, on its side facing away from the electronic component, has a pot-shaped widening.

The volume required for holding the fluid filler can also be provided in the area of the through orifice in the arrangement according to the present invention by providing a ring-shaped piece mounted on the through hole on its side facing away from the electronic component.

DETAILED DESCRIPTION

Figure 1:
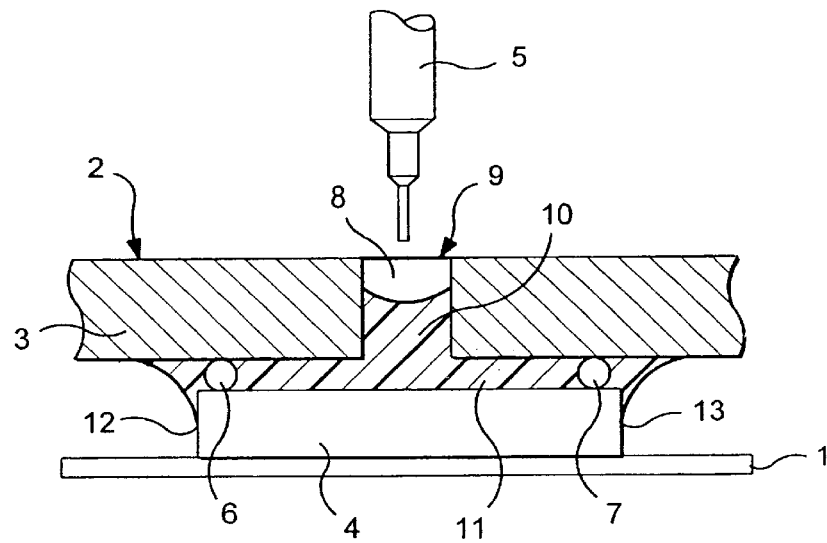
FIG. 1 schematically shows a device for carrying out the method according to the present invention with an arrangement including a substrate and an electronic component shown in cross-section.

FIG. 1 shows a transport device 1, with which an arrangement 2 including a substrate 3 and an electronic component 4 mounted on it is transported into the operating range of a dispenser 5. Arrangement 2 of a substrate 3 and an electronic component 4 is positioned on transport device 1, so that substrate 3 is located above electronic component 4.

As FIG. 1 further shows, electronic component 4 is connected to substrate 3 in the area of electrical contacts 6 and 7 forming arrangement 2 and is brought into the range of dispenser 5 in this form. Prior to this, a through orifice 8 is provided in substrate 3, at the center of electronic component 4. If arrangement 2 thus prepared and heated is brought into the position illustrated with respect to dispenser 5, free-flowing filler is applied from the dispenser onto end 9, facing away from electronic component 4, of through orifice 8. The amount applied of filler 10 becomes fluid under the effect of heat and is drawn into the space 11 between substrate 3 and electronic component 4 by capillary action. The air is displaced from the area of through orifice 8 by filler flowing in. Ultimately, filler 10 is fully distributed in space 11 and forms a meniscus-shaped sepal at edges 12 and 13 of electronic component 4.

Subsequently, substrate 3 is transported further either to pad with filler another electronic component mounted or to pad another substrate having an electronic component.

Figure 2:
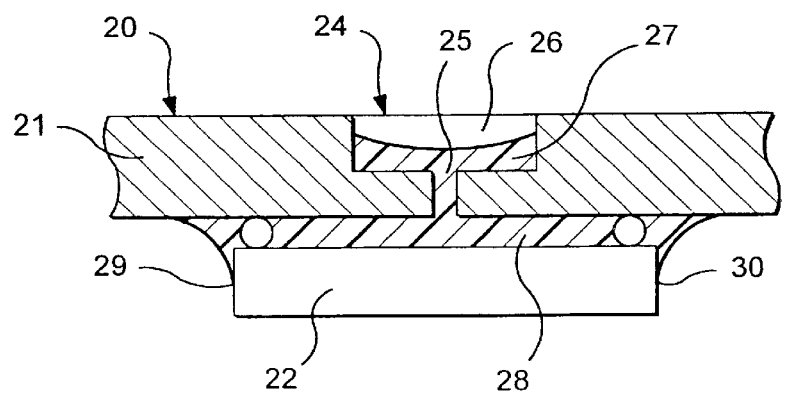
FIG. 2 shows an arrangement including a substrate and an electronic component padded by the method according to the present invention.

FIG. 2 shows an arrangement 20 padded according to the present invention with a substrate 21 and a mounted electronic component 22, in which substrate 21 has a pot-shaped widening 26 at end 24, facing away from electronic component 22, of a through orifice 25. Filler 27 is filled into this pot-shaped widening 26 in the padding process. The filler that has become fluid under the effect of heat flows into space 28 between substrate 21 and electronic component 22 by capillary action from the inside out and forms a meniscus-shaped seal at edges 29 and 30 of electronic component 22.

Figure 3:
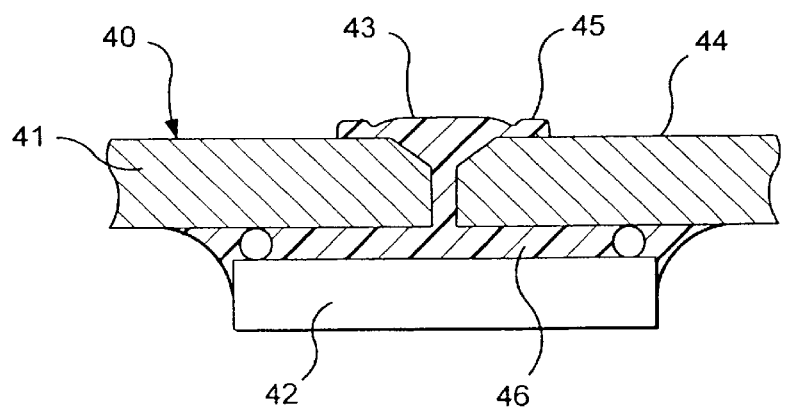
FIG. 3 shows another arrangement including a substrate and an electronic component also padded by the method according to the present invention.

Arrangement 40 according to FIG. 3, which includes a substrate 41 and an electronic component 42, basically corresponds to the arrangement 2 of FIG. 1. It differs from the arrangement of FIG. 1 basically by the fact that substrate 41 is provided, on its side 44 facing away from electronic component 42, with a piece 45 surrounding through orifice 46 forming a reservoir for filler 43.

What is claimed is:

1. An arrangement, comprising:

a flat substrate having at least one through orifice;

an electronic component mounted on the flat substrate;

a fluid filler padding a space between the flat substrate and the electronic component, the at least one through orifice positioned under the electronic component for applying the fluid filler, the at least one through orifice having a volume that is at least equal to an amount of fluid filler needed for padding the electronic component;

wherein the at least one through orifice has a pot-shaped widening at an end facing away from the electronic component.

* * * * *